United States Patent [19]

Kondo et al.

[11] Patent Number: 5,039,852
[45] Date of Patent: Aug. 13, 1991

[54] SEMICONDUCTOR IMAGE SENSOR

[75] Inventors: Masataka Kondo; Minori Yamaguchi; Yoshihisa Tawada, all of Hyogo, Japan

[73] Assignee: Kanegafuchi Chemical Industry Co., Ltd., Osaka, Japan

[21] Appl. No.: 450,701

[22] Filed: Dec. 14, 1989

[30] Foreign Application Priority Data

Dec. 16, 1988 [JP] Japan .................................. 63-318900

[51] Int. Cl.$^5$ .............................................. H01J 40/14
[52] U.S. Cl. .................... 250/211 J; 357/30 L
[58] Field of Search ............ 250/211 R, 211 J, 208.1, 250/208.2; 357/30 K, 30 L

[56] References Cited

U.S. PATENT DOCUMENTS 4,788,582 11/1988 Yamamoto et al. .............. 357/30 L
4,916,305 4/1990 Antell ................................ 250/211 J Primary Examiner—David C. Nelms
Attorney, Agent, or Firm—Jordan & Hamburg

[57] ABSTRACT

In the semiconductor image sensor according to the invention in which the photoconductivity of that region of the active layer producing carriers upon exposure to light which is on the light-transmitting electrode side is lower than that of the remaining region, crosstalk can be inhibited without mechanically dividing the semiconductor layer and without causing any significant decrease in sensor sensitivity.

5 Claims, 1 Drawing Sheet

SEMICONDUCTOR IMAGE SENSOR

BACKGROUND OF THE INVENTION

1. Field of the Invention

This invention relates to a semiconductor image sensor improved in crosstalk inhibition.

2. Description of the Prior Art

The materials used in the conventional semiconductor image sensors include, among others, the following:

a-Si:H, a-Si$_{1-x}$C$_x$:H, a-Si$_{1-x}$Ge$_x$:H, a-SiF:H, a-Si$_{1-x}$N$_x$:H, a-Ge:H,

μc-Si:H,

μc-Si$_{1-x}$C$_x$:H,

μc-Si$_{1-x}$Ge$_x$:H,

μc-SiF:H,

μc-Si$_{1-x}$N$_x$:H and

L μc-Ge:H wherein the prefix "a-" means that the material designated thereby is an amorphous semiconductor, the prefix "μc-" mean that the material designated thereby is a microcrystalline semiconductor, and x is a number within the range of $0 < x < 1.0$.

The semiconductor image sensors have heretofore been constituted by combining at least one thin film of the p, i or n conduction type, a metal electrode ("M" for short) and a transparent conductive film electrode ("TCO" for short), for example as follows:

M/i/p/TCO

M/p/i/TCO

M/i/TCO

M/n/i/p/TCO

M/p/i/n/TCO

M/i/i/TCO

FIG. 2 illustrates, in longitudinal section, one of the conventional semiconductor image sensors, which is of the construction M/i/p/TCO.

In this example, a common metal electrode 2 is formed on an insulator substrate 1 and then an i-type semiconductor layer 3 and a p-type semiconductor layer 4 are formed in that order. Furthermore, discrete transparent conductive film electrodes 5 are formed on the layer 4 by etching technique combined with photolithography technique, for instance.

A light flux L, applied to this image sensor from its transparent conductive film electrode (5) side, arrives at the semiconductor layers 4 and 3. Here, since the transparent conductive film has been constituted by discrete electrodes, discrete picture elements are formed in the semiconductor layers 4 and 3 disposed between the common metal electrode 2 and respective discrete electrodes 5 and the i-type semiconductor layer 3 of each picture element functions as an active layer to produce photocarriers. As these carriers are collected by discrete transparent conductive film electrodes 5, a picture signal is obtained. There have been cases in which the metal electrode is constituted by discrete electrodes while the transparent conductive film on the light incident side is made the common electrode.

In the conventional semiconductor image sensor mentioned above, the semiconductor layers 4 and 3 are not mechanically divided as are the discrete transparent conductive film electrodes 5 but since the conductivity of the p-type semiconductor layer 4 is generally maintained at a level not higher than $10^{-4}$ S/cm and the dark conductivity of the i-type semiconductor layer 3 at a level not higher than $10^{-9}$ S/cm, no interference conduction takes place between any two neighboring discrete electrodes 5. Nonetheless, on irradiation, the conductivity of the active i-type semiconductor layer 3 increases to a level beyond $10^{-7}$ S/cm, with the result that some conduction takes place between the adjacent discrete electrodes 5 and, hence, the crosstalk problem was inevitable.

To solve this problem, it has been proposed to mechanically divide the semiconductor layers into picture elements by etching technique combined with photolithography technique. However, this procedure makes the sensor manufacturing process complicated. Another means which is conceivable would comprise decreasing the overall photoconductivity of the active layer. This means, however, would markedly decrease the sensor sensitivity since there is a positive correlationship between photocarrier yield and photoconductivity.

Accordingly, it is an object of the invention to inhibit crosstalk in a semiconductor image sensor of the construction comprising a semiconductor layer containing an active layer capable of producing carriers upon exposure to light and electrodes one of which is light-transmitting and between which said semiconductor layer is sandwiched, without mechanically dividing the semiconductor layer and without reducing the sensor sensitivity.

SUMMARY OF THE INVENTION

The above object is accomplished by providing a semiconductor image sensor according to the invention which is characterized in that the photoconductivity of that region of the active layer which lies on the light-transmitting electrode side, or adjacent to said electrode, is lower than the photoconductivity of the other, or remaining, region of the active layer.

If the whole active layer is uniform in photoconductivity, this active layer will show the greatest conductivity increase in the plane adjoining to the light-transmitting electrode, which is on the incidence side, and the conductivity increase will decrease toward the opposite side exponentially to the power of the distance. On the contrary, the semiconductor image sensor according to the invention has a constitution such that this active layer region on the light-transmitting electrode side which shows a comparatively great conductivity increase is substituted with a semiconductor having a lower photoconductivity, so that crosstalk is inhibited efficiently. This substitution causes only a very slight decrease in sensor sensitivity. Thus, owing to such a low photoconductivity layer, crosstalk can be efficiently inhibited while the sensor sensitivity is maintained. The process for mechanically dividing the semiconductor layer into picture elements and disposing insulators between the adjacent picture elements is no longer necessary and accordingly the image sensor can be manufactured advantageously in a very simple and easy manner.

Furthermore, when the photoconductivity of the low photoconductivity layer is further decreased down to the dark conductivity of the remaining region of the active layer or to a still lower level, the photoconductivity and dark conductivity of the two-layer active layer can be substantially equalized.

In cases where the active layer is formed of an amorphous silicon semiconductor material, the low photoconductivity layer can be formed by adding an impurity, such as carbon, nitrogen, boron or phosphorus, to that active layer region situated on the light-transmitting electrode side.

The low photoconductivity layer should preferably have a thickness sufficient to absorb 45-99% of the incident light. Thus, for instance, the low photoconductivity layer should preferably have a thickness of 500-2,000 angstroms if the incident light has a wavelength of 550 nm.

DETAILED DESCRIPTION OF PREFERRED EMBODIMENTS

Figure 1:
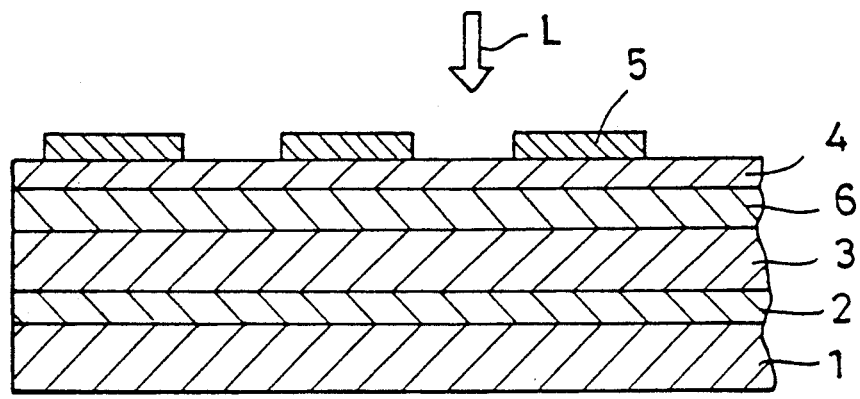
FIG. 1 schematically illustrates, in longitudinal section, the structure of a typical semiconductor image sensor according to the invention.
Figure 2:
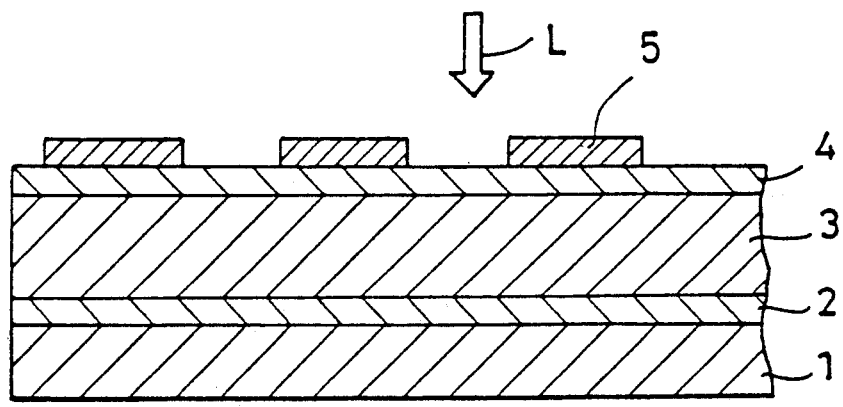
FIG. 2 schematically illustrates, in longitudinal section, the structure of a typical prior art semiconductor image sensor.

FIG. 1 is a schematic representation of the structure of a typical example of the semiconductor image sensor according to the invention.

In this image sensor, a common metal electrode 2 having a specified geometry is formed on an insulating substrate 1 by etching technique combined with photolithography technique. Then, an i-type semiconductor layer 3, a low photoconductivity semiconductor layer 6 and a p-type semiconductor layer 4 are formed in that order in a predetermined pattern using, for example, a metal mask by the technique of plasma CVD (chemical vapor deposition) or the like. Further, a transparent conductive layer 5 is formed all over the layer 4 by vacuum vapor deposition, for instance. Finally, discrete transparent conductive film electrodes 5 are formed, for example, by using the etching technique combined with photolithography technique.

For preparing the insulating substrate 1, a metal film coated with glass or some other insulating material is used, among others. The material constituting the common metal electrode 2 may be Cr, Al, Zr, Ti, Ni or W, for instance.

Suited for use as the i-type semiconductor layer 3 are the following semiconductor materials:

a-Si:H, a-Si$_{1-x}$Ge$_x$:H, a-SiF:H, a-Si$_{1-x}$N$_x$:H and a-Ge:H where x is within the range of $0 < X < 1.0$.

Suited for use as the low photoconductivity semiconductor layer 6 are the following semiconductor materials:

a-Si$_{1-x}$C$_x$:H and a-Si$_{1-x}$N$_x$:H where x is within the range of $0 < X < 1.0$.

The photoconductivity of the layer 6 can be reduced by 1 to 3 orders or more as compared with that of the i-type semiconductor layer 3 by doping amorphous silicon a-Si:H with carbon or nitrogen. In addition to carbon and nitrogen, such an impurity as boron or phosphorus may also be used for doping purposes.

Suitable as the p-type semiconductor layer 4 are the following semiconductor materials:

a-Si$_{1-x}$C$_x$:H, a-Si$_{1-x}$N$_x$:H,

-Ge:H,

μc-Si:H,

μc-Si$_{1-x}$C$_x$:H and

μc-Si$_{1-x}$N$_x$:H where x is in the range of $0 < X < 1.0$.

The material constituting the individual transparent conductive film electrodes 5 is, for example, TO or SnO2.

As in the conventional art, a light flux L enters this image sensor from the side of discrete transparent conductive film electrodes 5 and reaches the semiconductor layers 4, 6 and 3. Since the individual electrodes are respectively made of a transparent conductive film, the low photoconductivity semiconductor layer 6 and i-type semiconductor layer 3 of each picture element combinedly function as an active layer and produce photocarriers. Collecting of these carriers by the respective individual transparent conductive film electrodes 5 gives an image signal. Alternatively, the metal electrode may be constituted with discrete electrodes and the transparent conductive film disposed on the light incidence side may be used as the common electrode.

If the conductivity of the p-type semiconductor layer 4 is maintained, for example, at a level of $10^{-4}$ S/cm or lower and the dark conductivity of the i-type semiconductor layer 3 at $10^{-9}$ S/cm or lower, for instance, conduction will not occur between any two neighboring discrete electrodes, as in the prior art. When the photoconductivity of the low photoconductivity semiconductor layer 6 is decreased down to a level substantially equal to the dark conductivity of the i-type semiconductor layer 3, namely around $10^{-9}$ S/cm, the conductivity under irradiation of the active layer comprising the low photoconductivity semiconductor layer 6 and i-type semiconductor layer 3 can be made substantially equal to the dark conductivity of the i-type semiconductor layer 3. No conduction occurs between any two neighboring discrete transparent conductive film electrodes during irradiation, either.

Meanwhile, since the number of photocarriers produced in any semiconductor is nearly equal to that of photocarriers produced in another semiconductor if the two semiconductors are equal in absorption coefficient, the recombination coefficient in the semiconductor layer 6, which has a low photoconductivity, will be larger than that in the i-type semiconductor layer 3. However, since the distance between the discrete transparent conductive film electrodes 5 and the common metal electrode 2, i.e. the total thickness of the semiconductor layers 4, 6 and 3, is as short as 0.5 to 3 μm and the potential difference is 0.5 to 10 V, photocarriers are driven in a high electric field. In this kind of semiconductor image sensor wherein the i-type semiconductor layer 3 is substituted only in part, namely in that region adjacent to the discrete transparent conductive film electrodes 5, with a low photoconductivity semiconductive layer such as the layer 6, the decrease in sensor output is very slight.

The low photoconductivity semiconductor layer 6 preferably has a thickness sufficient to absorb not less than 45% but not more than 99% of the incident light. When the light source wavelength is 550 nm, the thickness of the low photoconductivity semiconductor layer 6 is preferably about 500 to 2,000 angstroms.

What is claimed is:

1. A semiconductor image sensor comprising two contiguous active semiconductor layers capable of producing carriers upon incidenced of light, said layers being disposed between two electrode units one of which is light-transmitting, wherein the layer on the light-transmitting electrode side is of a low photoconductivity which is lower than that of the other layer.

2. A semiconductor image sensor as claimed in claim 1, wherein the photoconductivity of said low photoconductivity layer is not higher than the dark conductivity of the other layer.

3. A semiconductor image sensor as claimed in claim 1, wherein the low photoconductivity layer is made of an amorphous silicon semiconductor doped with at least one impurity and the other layer is made of an undoped amorphous silicon semiconductor.

4. A semiconductor image sensor as claimed in claim 1, wherein the low photoconductivity layer has a thickness sufficient for absorption of 45–99% of the incident light.

5. A semiconductor image sensor as claimed in claim 4, wherein said low photoconductivity layer has a thickness of 500–2,000 angstroms for an incident light having a wavelength of 550 nm.

* * * * *